(12) United States Patent
Chan et al.

(10) Patent No.: US 10,429,412 B2
(45) Date of Patent: Oct. 1, 2019

(54) TEST CIRCUIT, TEST METHOD, ARRAY SUBSTRATE AND MANUFACTURING METHOD THEREOF

(71) Applicant: BOE Technology Group Co., Ltd., Beijing (CN)

(72) Inventors: Yucheng Chan, Beijing (CN); Dong Li, Beijing (CN); Bin Zhang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 15 days.

(21) Appl. No.: 15/841,911

(22) Filed: Dec. 14, 2017

(65) Prior Publication Data

US 2018/0284153 A1 Oct. 4, 2018

(30) Foreign Application Priority Data

Mar. 31, 2017 (CN) .......................... 2017 1 0210639

(51) Int. Cl.
*G01R 1/04* (2006.01)
*G01R 31/317* (2006.01)
*G01R 31/26* (2014.01)
*G01R 3/00* (2006.01)

(52) U.S. Cl.
CPC ....... *G01R 1/0416* (2013.01); *G01R 31/2621* (2013.01); *G01R 31/31723* (2013.01); *G01R 3/00* (2013.01)

(58) Field of Classification Search
None
See application file for complete search history.

(56) References Cited

U.S. PATENT DOCUMENTS

| | | | |
|---|---|---|---|
| 5,777,930 A | 7/1998 | Sugiura et al. | |
| 9,230,871 B1 | 1/2016 | Wang et al. | |
| 2008/0224725 A1 | 9/2008 | Sugawa et al. | |
| 2010/0073009 A1 | 3/2010 | Wang et al. | |
| 2013/0033285 A1* | 2/2013 | McMahon | G01R 31/2621 324/762.09 |
| 2014/0244194 A1* | 8/2014 | Shin | G09G 3/006 702/64 |
| 2017/0194222 A1 | 7/2017 | Liu et al. | |
| 2018/0212011 A1 | 7/2018 | Lai et al. | |
| 2018/0284153 A1 | 10/2018 | Chan et al. | |

FOREIGN PATENT DOCUMENTS

| | | |
|---|---|---|
| CN | 101147264 A | 3/2008 |
| CN | 101359024 A | 2/2009 |
| CN | 101359024 B | 5/2012 |
| CN | 101147264 B | 6/2012 |

(Continued)

*Primary Examiner* — Clayton E. LaBalle
*Assistant Examiner* — Jas A Sanghera
(74) *Attorney, Agent, or Firm* — Fay Sharpe LLP (57) ABSTRACT

A test circuit, a test method, an array substrate and a manufacturing method thereof are provided. The test circuit includes a plurality of to-be-tested units and plurality of test electrodes connected to the to-be-tested units. The plurality of to-be-tested units are arranged in a matrix. At least one of the test electrodes is multiplexed by the plurality of to-be-tested units in a row direction and at least one of the test electrodes is multiplexed by the plurality of to-be-tested units in a column direction.

18 Claims, 6 Drawing Sheets

(56) References Cited

FOREIGN PATENT DOCUMENTS

| | | | |
|---|---|---|---|
| CN | 105185816 | A | 12/2015 |
| CN | 105336731 | A | 2/2016 |
| CN | 105609023 | A | 5/2016 |
| CN | 106468758 | A | 3/2017 |
| CN | 106935570 | A | 7/2017 |
| JP | H06334010 | A | 12/1994 |
| JP | H0727816 | A | 1/1995 |
| JP | 2003078170 | A | 3/2003 |
| JP | 4876356 | B2 | 2/2012 |

\* cited by examiner

TEST CIRCUIT, TEST METHOD, ARRAY SUBSTRATE AND MANUFACTURING METHOD THEREOF

This application claims priority to Chinese Patent Application No.: 201710210639.6, filed with the State Intellectual Property Office on Mar. 31, 2017 and titled "Test Circuit, Test Method, Array Substrate and Manufacturing Method thereof", which is incorporated herein by reference in its entirety.

TECHNICAL FIELD

The present disclosure relates to the field of display technology and in particular to a test circuit, a test method, an array substrate and a manufacturing method thereof.

BACKGROUND

With the increasingly stricter requirement for the definition of display apparatuses, the requirement for the effectiveness and instantaneity of the process capability detection is also becoming higher and higher for products with a high recognition rate. For thin-film transistors with a top gate structure employing a low temperature polycrystalline silicon technology, since there are many optical masks during production and the process is complicated, the cost and time for producing the products will be greatly wasted if the defective products cannot be tested instantaneously during the production.

In order to solve the above problems, the process property during the production process of the products is tested with a plurality of test element groups (TEG) separately. In the prior art, each test element group can only test one component in a display apparatus and needs to be provided with a separate test electrode.

In the prior art, there are many test electrodes for a test element group, causing the structure of the test circuit to be complicated, and thus resulting in a low test efficiency and high test cost.

SUMMARY

In order to at least partially solve the problems in the prior art, embodiments of the present disclosure provide a test circuit, a test method, an array substrate and a manufacturing method thereof.

The present disclosure provides a test circuit. The test circuit includes a plurality of to-be-tested units and a plurality of test electrodes connected to the to-be-tested units. The plurality of to-be-tested units are arranged in a matrix. At least one of the test electrodes is multiplexed by the plurality of to-be-tested units in a row direction, and at least one of the test electrodes is multiplexed by the plurality of to-be-tested units in a column direction.

In some embodiments, the plurality of to-be-tested units in any row direction multiplex two of the test electrodes, and the plurality of to-be-tested units in any column direction multiplex one of the test electrodes.

In some embodiments, the plurality of to-be-tested units in adjacent two rows multiplex one of the test electrodes.

In some embodiments, each of the to-be-tested units includes a first to-be-tested component and a second to-be-tested component connected to the first to-be-tested component. The first to-be-tested components of the plurality of to-be-tested units in any row direction multiplex two of the test electrodes, the second to-be-tested components of the plurality of to-be-tested units in any row direction multiplex two of the test electrodes, and the first to-be-tested components and the second to-be-tested components of the plurality of to-be-tested units in any column direction multiplex one of the test electrodes.

In some embodiments, the first to-be-tested components and the second to-be-tested components of the plurality of to-be-tested units in any row direction multiplex two of the test electrodes.

In some embodiments, the to-be-tested unit further includes a third to-be-tested component connected to the first to-be-tested component and to the second to-be-tested component.

In some embodiments, the first to-be-tested component is a first thin film transistor, the second to-be-tested component is a second thin film transistor, and the third to-be-tested component is a capacitor. The second electrode of the first thin film transistor is connected to a first node, the control electrode of the second thin film transistor is connected to the first node, the first end of the capacitor is connected to the first node, and the second end of the capacitor is connected to the second electrode of the second thin film transistor.

In some embodiments, the control electrodes of the first thin film transistors and the first electrodes of the second thin film transistors of the plurality of to-be-tested units in any row direction multiplex one of the test electrodes. The first electrodes of the first thin film transistors and the second electrodes of the second thin film transistors of the plurality of to-be-tested units in any row direction multiplex one of the test electrodes. The second electrodes of the first thin film transistors of the plurality of to-be-tested units in any column direction multiplex one of the test electrodes.

In some embodiments, the first electrode and the control electrode of the first thin film transistor are connected to two test electrodes respectively, and the first electrode and the second electrode of the second thin film transistor are connected to two test electrodes respectively.

In some embodiments, the control electrodes of the second thin film transistors of the plurality of to-be-tested units in any column direction multiplex one of the test electrodes.

In some embodiments, the second electrodes of the first thin film transistors and the control electrodes of the second thin film transistors of the plurality of to-be-tested units in any column direction multiplex one of the test electrodes.

In some embodiments, the first electrode of the second thin film transistor of the to-be-tested unit in any row except the first row and the second electrode of the second thin film transistor of the to-be tested unit correspondingly arranged in the previous row are connected and multiplex one of the test electrodes.

In some embodiments, the control electrode of the first thin film transistor and the first electrode of the second thin film transistor of the to-be-tested unit in any row except the first row and the first electrode of the first thin film transistor and the second electrode of the second thin film transistor of the to-be-tested unit correspondingly arranged in the previous row multiplex one of the test electrodes.

The present disclosure further provides an array substrate. The array substrate includes a basal substrate and the test circuit above.

The present disclosure further provides a method for manufacturing the array substrate above. The method includes: forming a test circuit on a basal substrate.

In some embodiments, forming the test circuit on the basal substrate includes: forming a first active layer and a second active layer on the basal substrate; forming a gate insulator layer on the first active layer and the second active layer; forming the control electrode of the first thin film transistor, a connection pattern and the control electrode of the second thin film transistor on the gate insulator layer; forming an interlayer dielectric on the control electrode of the first thin film transistor, the control electrode of the second thin film transistor and the connection pattern; performing a patterning process on the interlayer dielectric and the gate insulator layer to form a first via hole, a second via hole, a third via hole, a fourth via hole and a fifth via hole; and forming the first electrode of the first thin film transistor, the second electrode of the first thin film transistor, the first electrode of the second thin film transistor and the second electrode of the second thin film transistor on the interlayer dielectric. The first electrode of the first thin film transistor is connected to the first active layer through the second via hole, the second electrode of the first thin film transistor is connected to the first active layer through the third via hole, the second electrode of the first thin film transistor is connected to the connection pattern through the first via hole, the first electrode of the second thin film transistor is connected to the second active layer through the fourth via hole, the second electrode of the second thin film transistor is connected to the second active layer through the fifth via hole, and a capacitor is formed between the second electrode of the second thin film transistor and the connection pattern.

The present disclosure further provides a method for testing the test circuit above. The test method includes: loading an input and scanning signal to at least one of the test electrodes connected to the to-be-tested units; and reading an output signal from one of the test electrodes connected to the to-be-tested units.

In some embodiments, the input and scanning signal includes an input signal and a scanning signal; loading the input and scanning signal to the at least one of the test electrodes connected to the to-be-tested units includes: loading the scanning signal to the test electrode connected to the control electrodes of the first thin film transistors of the to-be-tested units, and loading the input signal to the test electrode connected to the first electrodes of the first thin film transistors of the to-be-tested units; and reading the output signal from one of the test electrodes connected to the to-be-tested units includes: reading the output signal from the test electrode connected to the second electrodes of the first thin film transistors of the to-be-tested units; or the input and scanning signal includes an input signal and a scanning signal; loading the input and scanning signal to the at least one of the test electrodes connected to the to-be-tested units includes: loading the scanning signal to the test electrode connected to the control electrodes of the second thin film transistors of the to-be-tested units, and loading the input signal to the test electrode connected to the first electrodes of the second thin film transistors of the to-be-tested units; and reading the output signal from one of the test electrodes connected to the to-be-tested units includes: reading the output signal from the test electrode connected to the second electrodes of the second thin film transistors of the to-be-tested units; or loading the input and scanning signal to the at least one of the test electrodes connected to the to-be-tested units includes: loading the input and scanning signal to the test electrode connected to the first ends of the capacitors of the to-be-tested units; and reading the output signal from one of the test electrodes connected to the to-be-tested units includes: reading the output signal from the test electrode connected to the second ends of the capacitors of the to-be-tested units.

The present disclosure further provides a non-transitory readable storage medium storing instructions that, when executed by a processing component, cause the processing component to perform the test method above.

DETAILED DESCRIPTION

In order to allow those skilled in the art to better understand the technical solutions of the present disclosure, the test circuit, the test method, the array substrate and the manufacturing method thereof provided in the present disclosure will be described in detail in combination with the accompanying drawings.

Figure 1:
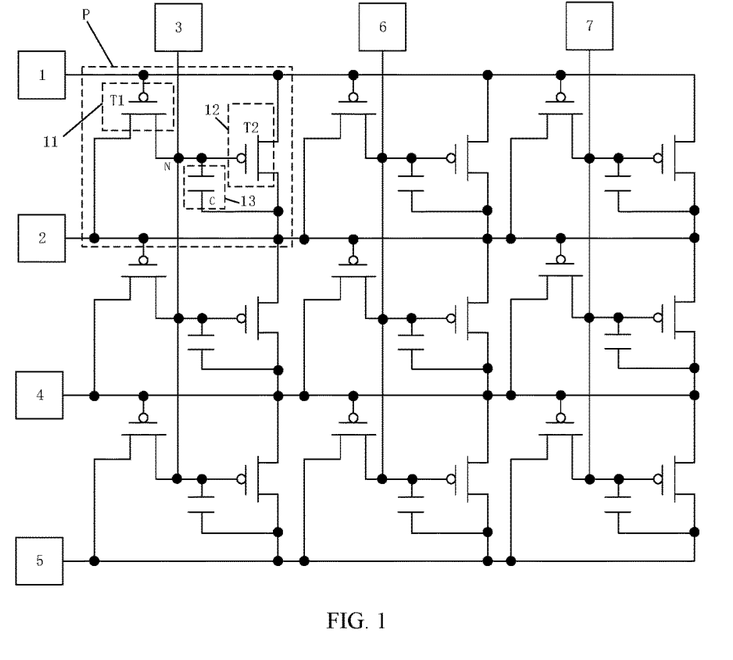
FIG. 1 is a structural schematic diagram of a test circuit provided in an embodiment of the present disclosure.

FIG. 1 is a structure diagram of a test circuit provided in accordance with an embodiment of the present disclosure. As shown in FIG. 1, the test circuit includes a plurality of to-be-tested units P and a plurality of test electrodes connected to the to-be-tested units P. The plurality of to-be-tested units P are arranged in a matrix. At least one of the test electrodes is multiplexed by the plurality of to-be-tested units P in a row direction. At least one of the test electrodes is multiplexed by the plurality of to-be-tested units P in a column direction.

One test electrode being multiplexed by a plurality of to-be-tested units may mean that the one test electrode is connected to the plurality of to-be-tested units and the one test electrode may test the plurality of to-be-tested units at the same time.

In the embodiments of the present disclosure, FIG. 1 merely illustrates a plurality of to-be-tested units P arranged in a 3-order matrix (arranged in a 3*3 matrix) and 7 test electrodes. As shown in FIG. 1, the 7 test electrodes are respectively test electrodes 1 to 7. Test electrodes 1, 2, 4 and 5 are disposed at the left side of the plurality of to-be-tested units P arranged in a matrix. Test electrodes 3, 6 and 7 are disposed at the upper side of the plurality of to-be-tested units P arranged in a matrix. In practice, the position of the test electrode 7 may be changed in accordance with the design requirements, and all of the positions of the 7 test electrodes may be changed in accordance with the design requirements, which will not be enumerated here.

In the embodiments of the present disclosure, alternatively, a plurality of to-be-tested units P in any row direction multiplex two test electrodes, and a plurality of to-be-tested units P in any column direction multiplex one test electrode. As shown in FIG. 1, for example, a plurality of to-be-tested units P in the first row multiplex test electrodes 1 and 2, and a plurality of to-be-tested units P in the first column multiplex test electrode 3.

In some embodiments, it can be seen from FIG. 1 that the plurality of to-be-tested units P in adjacent two rows may multiplex one test electrode. For example, the plurality of to-be-tested units P in the first row and the plurality of to-be-tested units P in the second row may multiplex test electrode 2. The plurality of to-be-tested units P in the second row and plurality of to-be-tested units P in the third row may multiplex test electrode 3.

It should be noted that FIG. 1 merely illustrates a plurality of to-be-tested units P arranged in a 3-order matrix (arranged in a 3*3 matrix). The plurality of to-be-tested units P in the embodiments of the present disclosure are not limited to be arranged in a 3-order matrix, and may also be arranged in other order matrices, and the number of the corresponding test electrodes is also different, which will not be enumerated here.

In the embodiments of the present disclosure, the plurality of to-be-tested units P in each column multiplex one test electrode, the plurality of to-be-tested units P in each row multiplex two test electrodes, and the plurality of to-be-tested units P in adjacent two rows may multiplex one test electrode. Therefore, the number of the test electrodes needed in the test circuit may be the sum of the number of rows and the number of columns of the to-be-tested units plus 1.

For example, in the test circuit shown in FIG. 1, the plurality of to-be-tested units P are arranged in a 3-order matrix. The three columns of to-be-tested units need 3 test electrodes in total, and the three rows of to-be-tested units need 4 test electrodes in total. Therefore, the number of the test electrodes needed in the test circuit is: the number of rows 3+the number of columns 3+1=7.

In the embodiments of the present disclosure, alternatively, the to-be-tested unit P includes a first to-be-tested component 11 and a second to-be-tested component 12 connected to the first to-be-tested component 11. The first to-be-tested components 11 of a plurality of to-be-tested units P in any row direction multiplex two test electrodes. The second to-be-tested components 12 of a plurality of to-be-tested units P in any row direction multiplex two test electrodes. The first to-be-tested components 11 and the second to-be-tested components 12 of a plurality of to-be-tested units P in any column direction multiplex one test electrode. As shown in FIG. 1, for example, the first to-be-tested components 11 of the plurality of to-be-tested units P in the first row multiplex test electrodes 1 and 2, the second to-be-tested components 12 of the plurality of to-be-tested units P in the first row multiplex test electrodes 1 and 2, and the first to-be-tested components 11 and the second to-be-tested components 12 of the plurality of to-be-tested units P in the first column multiplex test electrode 3.

In the embodiments of the present disclosure, the first to-be-tested components 11 and the second to-be-tested components 12 of the plurality of to-be-tested units P in adjacent two rows multiplex one test electrode. As shown in FIG. 1, the first to-be-tested components 11 and the second to-be-tested components 12 of the plurality of to-be-tested units P in the first row multiplex test electrode 2, and the first to-be-tested components 11 and the second to-be-tested components 12 of the plurality of to-be-tested units P in the second row also multiplex test electrode 2.

In the embodiments of the present disclosure, alternatively, the first to-be-tested components 11 and the second to-be-tested components 12 of a plurality of to-be-tested units P in any row direction multiplex two test electrodes. That is, the two test electrodes multiplexed by the first to-be-tested components 11 of a plurality of to-be-tested units P in any row direction are the same two test electrodes multiplexed by the second to-be-tested components 12 of the plurality of to-be-tested units P in this row direction. As shown in FIG. 1, for example, the first to-be-tested components 11 and the second to-be-tested components 12 of the plurality of to-be-tested units P in the first row multiplex test electrodes 1 and 2. That is, the first to-be-tested components 11 of the plurality of to-be-tested units in the first row multiplex test electrodes 1 and 2, and the second to-be-tested components 12 of the plurality of to-be-tested units in the first row also multiplex test electrodes 1 and 2.

In the embodiments of the present disclosure, alternatively, the to-be-tested unit P also includes a third to-be-tested component 13. The third to-be-tested component 13 is connected to the first to-be-tested component 11 and to the second to-be-tested component 12.

In the embodiments of the present disclosure, alternatively, in each to-be-tested unit P, the first to-be-tested component 11 is a first thin film transistor T1, the second to-be-tested component 12 is a second thin film transistor T2, and the third to-be-tested component 13 is a capacitor C. The second electrode of the first thin film transistor T1 is connected to a first node N, the control electrode of the second thin film transistor T2 is connected to the first node N, the first end of the capacitor C is connected to the first node N, and the second end of the capacitor is connected to the second electrode of the second thin film transistor T2. The control electrode of the first thin film transistor T1 is connected to a test electrode, and the first electrode of the first thin film transistor T1 is connected to another test electrode. The first electrode of the second thin film transistor T2 is connected to a test electrode, and the second electrode of the second thin film transistor T2 is connected to another test electrode.

It should be noted that the structure of the to-be-tested unit P in the embodiments of the present disclosure is not limited to that shown in FIG. 1. The to-be-tested unit P may also be a structure including other several thin film transistors and capacitors, which may be designed in accordance with the circuit structure of a display area to be tested, which will be enumerated in embodiments of the present disclosure.

In embodiments of the present disclosure, alternatively, the control electrodes of the first thin film transistors T1 and the first electrodes of the second thin film transistors T2 of the plurality of to-be-tested units P in any row direction multiplex one test electrode. The first electrodes of the first thin film transistors T1 and the second electrodes of the second thin film transistors T2 of the plurality of to-be-tested units P in any row direction multiplex one test electrode. The second electrodes of the first thin film transistors T1 of the plurality of to-be-tested units in any column direction multiplex one test electrode.

As shown in FIG. 1, for example, the control electrodes of the first thin film transistors T1 and the first electrodes of the second thin film transistors T2 of the plurality of to-be-tested units P in the first row multiplex test electrode 1. The first electrodes of the first thin film transistors T1 and the second electrodes of the second thin film transistors T2 of the plurality of to-be-tested units P in the first row multiplex test electrode 2. The second electrodes of the first thin film transistors T1 of the plurality of to-be-tested units in the first column multiplex test electrode 3.

In the embodiments of the present disclosure, in each to-be-tested unit P, the second electrode of the first thin film transistor T1 is connected to the control electrode of the second thin film transistor T2 through the first node N. Therefore, the control electrodes of the second thin film transistor T2 of the plurality of to-be-tested units P in any column direction multiplex one test electrode. As shown in FIG. 1, for example, the control electrodes of the second thin film transistor T2 of the plurality of to-be-tested units P in the first column multiplex test electrode 3.

In the embodiments of the present disclosure, alternatively, the second electrodes of the first thin film transistors T1 and the control electrodes of the second thin film transistors T2 of the plurality of to-be-tested units P in any column direction multiplex one test electrode. That is, the test electrode multiplexed by the second electrodes of the first thin film transistors T1 of the plurality of to-be-tested units P in any column direction is the same test electrode multiplexed by the control electrodes of the second thin film transistors T2 of the plurality of to-be-tested units P in this column direction. As shown in FIG. 1, for example, the second electrodes of the first thin film transistors T1 and the control electrodes of the second thin film transistors T2 of the plurality of to-be-tested units P in the first column multiplex test electrode 3.

In the embodiments of the present disclosure, alternatively, the first electrode of the second thin film transistor T2 of the to-be-tested unit P in any row except the first row and the second electrode of the second thin film transistor T2 of the to-be-tested unit P correspondingly arranged in a previous row are connected and multiplex one test electrode. The to-be-tested unit arranged corresponding to a certain to-be-tested unit refers to the to-be-tested unit disposed in the row prior to the row of the certain to-be-tested unit, and in the same column of the certain to-be-tested unit. As shown in FIG. 1, for example, the first electrode of the second thin film transistor T2 of the to-be-tested unit P in the second row and the second electrode of the second thin film transistor T2 of the to-be-tested unit P correspondingly arranged in the first row are connected and multiplex test electrode 2.

In the embodiments of the present disclosure, the control electrode of the first thin film transistor T1 of the to-be-tested unit P in any row except the first row and the first electrode of the first thin film transistor T1 of the to-be-tested unit P correspondingly arranged in the previous row are connected and multiplex one test electrode. That is, among the plurality of first thin film transistors in the same column, for each first thin film transistor except the first thin film transistor in the first row, its control electrode and the first electrode of the first thin film transistor in the previous row are connected and multiplex one test electrode. As shown in FIG. 1, for example, the control electrode of the first thin film transistor T1 of the to-be-tested unit P in the second row and the first electrode of the first thin film transistor T1 of the to-be-tested unit P correspondingly arranged in the first row are connected and multiplex test electrode 2.

In the embodiments of the present disclosure, alternatively, the control electrode of the first thin film transistor T1 and the first electrode of the second thin film transistor T2 of the to-be-tested unit P in any row except the first row and the first electrode of the first thin film transistor T1 and the second electrode of the second thin film transistor T2 of the to-be-tested unit P in the previous row multiplex one test electrode. As shown in FIG. 1, for example, the control electrode of the first thin film transistor T1 and the first electrode of the second thin film transistor T2 of the to-be-tested unit P in the second row and the first electrode of the first thin film transistor T1 and the second electrode of the second thin film transistor T2 of the to-be-tested unit P in the first row multiplex test electrode 2.

It should be noted that as to the manner for connecting the first thin film transistors T1 and the second thin film transistors T2 to the test electrodes, the embodiments of the present disclosure merely enumerate the manner for connecting the first thin film transistors T1 and the second thin film transistors T2 of the to-be-tested units P in the first row to the test electrodes, the manner for connecting the first thin film transistors T1 and the second thin film transistors T2 of the to-be-tested units P in the first column to the test electrodes and the manner for connecting the to-be-tested units P in the first row and the to-be-tested units P in the second row to the test electrode. The manner for connecting the first thin film transistors T1 and the second thin film transistors T2 of the to-be-tested units P in other rows to the test electrodes may be referenced to the manner for connecting the first thin film transistors T1 and the second thin film transistors T2 of the to-be-tested units P in the first row. The manner for connecting first thin film transistors T1 and the second thin film transistors T2 of the to-be-tested units P in other columns to the test electrodes may be made reference to the manner for connecting first thin film transistors T1 and the second thin film transistors T2 of the to-be-tested units P in the first column to the test electrodes, which will not be enumerated here.

Figure 12:
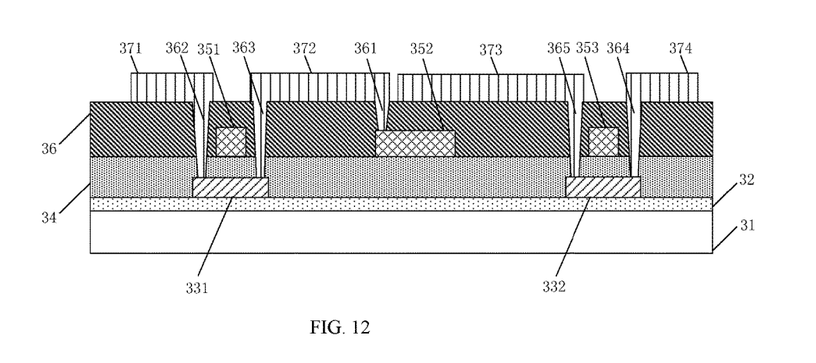
FIG. 12 is a schematic diagram of forming a first electrode and a second electrode of each thin film transistor in an embodiment of the present disclosure.

In practice, the test circuit is arranged on a basal substrate of an array substrate and disposed in the non-display area of the array substrate. The substrate is provided with a connection pattern. The first thin film transistor T1 further includes a first active layer. The second thin film transistor T2 further includes a second active layer. The first active layer and the second active layer are disposed on the basal substrate and arranged in the same layer. The control electrode of the first thin film transistor T1 is disposed on the first active layer, i.e., on the side of the first active layer away from the basal substrate. The control electrode of the second thin film transistor T2 is disposed on the second active layer, i.e., on the side of the second active layer away from the basal substrate. The test electrode, the control electrode of the first thin film transistor T1, the control electrode of the second thin film transistor T2 and the connection pattern are arranged in the same layer and formed with the same material. The first electrode of the first thin film transistor T1 is disposed on the control electrode of the first thin film transistor T1 and is connected to the first active layer through a via hole. The second electrode of the first thin film transistor T1 is disposed on the connection pattern and is connected to the connection pattern through a via hole. That is, both the first electrode and the second electrode of the first thin film transistor T1 are disposed on the side of the control electrode away from the basal substrate. The second electrode of the first thin film transistor T1 is further connected to the first active layer through a via hole. The first electrode of the second thin film transistor T2 and the second electrode of the second thin film transistor T2 are disposed on the connection pattern. That is, both the first electrode and the second electrode of the second thin film transistor T2 are disposed on the side of the connection pattern away from the basal substrate. The first electrode and the second electrode of the second thin film transistor T2 are connected to the second active layer through via holes respectively. A capacitor C is formed between the second electrode of the second thin film transistor T2 and the connection pattern. The first electrode of the first thin film transistor T1 and the second electrode of the first thin film transistor T1 and the first electrode of the second thin film transistor T2 and the second electrode of the second thin film transistor T2 are arranged in the same layer. It should be noted that in practice, the specific structure of the test circuit on the basal substrate of the array substrate may be made reference to the specific description of the manufacturing method proposed in the following embodiment, as shown in FIG. 12, which will not be described anymore.

In the embodiments of the present disclosure, the control electrode of the first thin film transistor is a gate electrode, the first electrode of the first thin film transistor is a source electrode, and the second electrode of the first thin film transistor is a drain electrode. Alternatively, the first electrode of the first thin film transistor is a drain electrode, and the second electrode of the first thin film transistor is a source electrode. Likewise, the control electrode of the second thin film transistor is a gate electrode, the first electrode of the second thin film transistor is a source electrode, and the second electrode of the second thin film transistor is a drain electrode. Alternatively, the first electrode of the second thin film transistor is a drain electrode, and the second electrode of the second thin film transistor is a source electrode.

In the test circuit provided in the embodiments of the present disclosure, a plurality of to-be-tested units are arranged in a matrix, a plurality of electrode units in a row direction multiplex at least one test electrode, and a plurality of electrode units in a column direction multiplex at least one test electrode. By reducing the number of the test electrodes and simplifying the structure of the test circuit, the detection efficiency is improved and the test cost is reduced. The test circuit provided in the embodiments of the present disclosure may also detect and monitor the properties of the display components instantaneously and detect defective products effectively in real time, thereby saving the cost and time for producing the products.

An array substrate is provided in the embodiments of the present disclosure. The array substrate includes a basal substrate and the test circuit provided in the above embodiments. The specific description of the test circuit may be made reference to the above embodiments, which will not be described here anymore.

It should be noted that the test circuit is disposed in the non-display area of the array substrate. The specific description may be made reference to the description about the following FIG. 14 and FIG. 15.

In the array substrate provided in the embodiments of the present disclosure, a plurality of to-be-tested units are arranged in a matrix, a plurality of to-be-tested units in a row direction multiplex at least one test electrode, and a plurality of to-be-tested units in a column direction multiplex at least one test electrode. By reducing the number of the test electrodes and simplifying the structure of the test circuit, the detection efficiency is improved and the test cost is reduced. The test circuit in the array substrate provided in the embodiments of the present disclosure may also detect and monitor the properties of the display components instantaneously and detect defective products effectively in real time, thereby saving the cost and time for producing the products.

Figure 2:
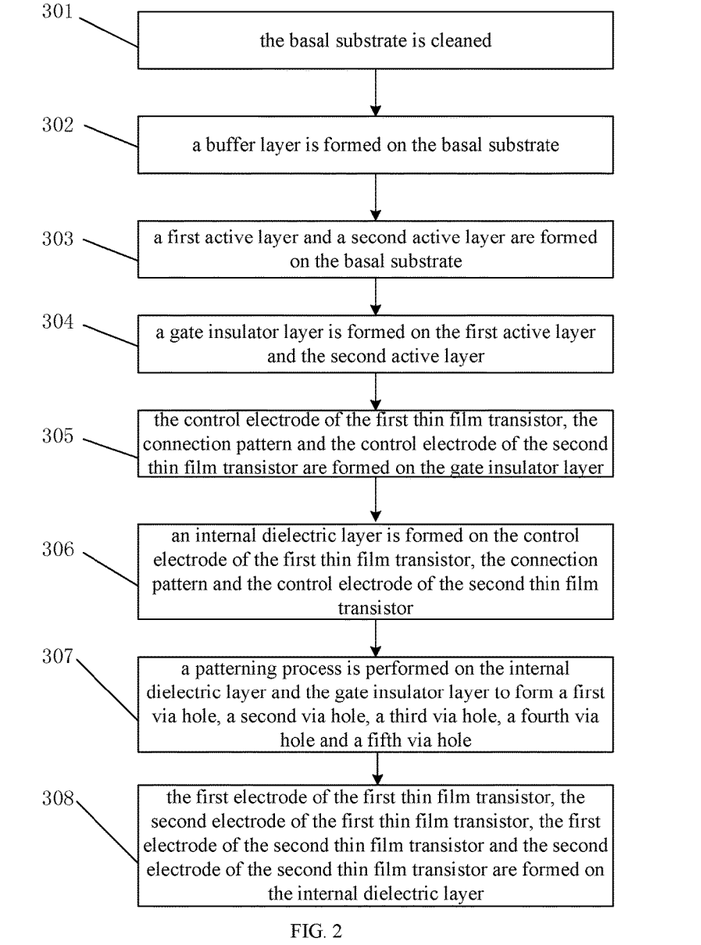
FIG. 2 is a flow chart of a method for manufacturing an array substrate provided in an embodiment of the present disclosure.

FIG. 2 is a flow chart of a method for manufacturing an array substrate provided in accordance with an embodiment of the present disclosure. The method includes: forming a test circuit on a basal substrate. The test circuit is a test circuit provided in the above embodiment. For example, the test circuit formed on the basal substrate may be the one shown in FIG. 1.

In some embodiments, the test circuit is formed in the non-display area of the array substrate.

Specifically, as shown in FIG. 2, forming the test circuit on the basal substrate includes the following steps:

Step 301, the basal substrate is cleaned.

In this step, the basal substrate 31 is made of a transparent material such as glass. That is, the basal substrate 31 may be a transparent one, and may also be made of a light-guiding and non-metal material with a certain hardness such as quartz, transparent resin, etc.

Step 302, a buffer layer is formed on the basal substrate.

Specifically, step 302 includes depositing the buffer layer on the basal substrate.

Figure 3:
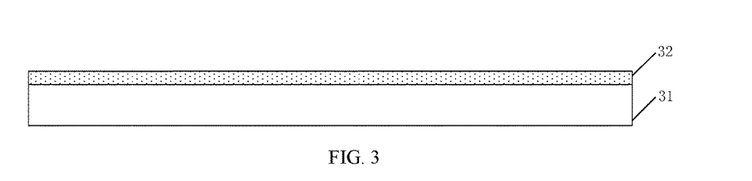
FIG. 3 is a schematic diagram of forming a buffer layer in an embodiment of the present disclosure.

As shown in FIG. 3, alternatively, the buffer layer 32 is deposited on the basal substrate 31 using Plasma Enhanced Chemical Vapor Deposition (PECVD). Alternatively, the buffer layer 32 may be formed by way of sputtering. The buffer layer 32 covers the basal substrate 31. Alternatively, the material of the buffer layer 32 is silicon oxide or silicon nitride.

In the embodiments of the present disclosure, alternatively, the buffer layer 32 may also be a multi-layered structure. For example, the buffer layer 32 includes a first buffer layer and a second buffer layer. For example, the first buffer layer may be a silicon oxide layer and the second buffer layer may be a silicon nitride layer. That is, the buffer layer 32 in the embodiments of the present disclosure is not limited to be a single-layered structure.

In the embodiments of the present disclosure, alternatively, when the buffer layer 32 is a multi-layered structure, the first buffer layer is formed on the basal substrate and the second buffer layer is formed on the first buffer layer. That is, the second buffer layer is formed at the side of the first buffer layer away from the basal substrate.

In the embodiments of the present disclosure, alternatively, when the buffer layer 32 is a multi-layered structure, the thickness of the silicon oxide layer is 50-100 nm and the thickness of the silicon nitride layer is 100-300 nm.

Step 303, a first active layer and a second active layer are formed on the basal substrate.

Specifically, the first active layer and the second active layer are formed on the buffer layer. That is, the first active layer and the second active layer are formed on the buffer layer away from the basal substrate.

In some embodiments, the first active layer and the second active layer are formed in the same layer.

In some embodiments, the material of the first active layer and the material of the second active layer are both amorphous silicon (a-Si).

Specifically, step 303 includes.

Step 3031, an active layer is deposited on the buffer layer.

Figure 4:
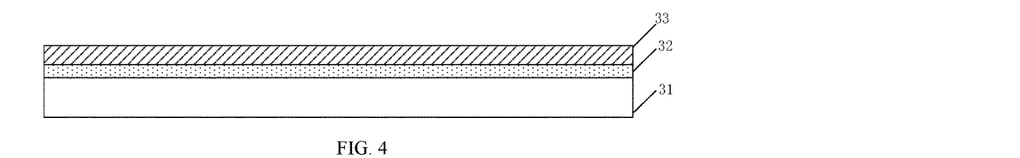
FIG. 4 is a schematic diagram of forming an active layer in an embodiment of the present disclosure.

As shown in FIG. 4, alternatively, the active layer 33 is deposited on the buffer layer 32 using Plasma Enhanced Chemical Vapor Deposition (PECVD). Alternatively, the buffer layer 32 may also be formed by way of sputtering. Alternatively, the active layer 33 is an a-Si thin film. That is, a-Si may be deposited on the side of the buffer layer 32 away from the basal substrate to form the active layer 33.

Step 3032, the basal substrate is placed into a high temperature oven for high temperature treatment.

It should be noted that when the active layer 33 is an a-Si thin film, the basal substrate 31 is subject to a high temperature treatment for dehydrogenation, i.e. reducing the content of hydrogen element in the active layer 33, such that the content of hydrogen element in the active layer 33 is smaller than or equal to 2%.

Step 3033, an excimer laser annealing treatment is performed on the active layer.

In this step, when the active layer 33 is an a-Si thin film, an excimer laser annealing (ELA) treatment is performed to the active layer 33 for transforming the a-Si thin film into a polycrystalline silicon thin film.

Step 3034, a patterning process is performed on the active layer to form the first active layer and the second active layer.

Figure 5:
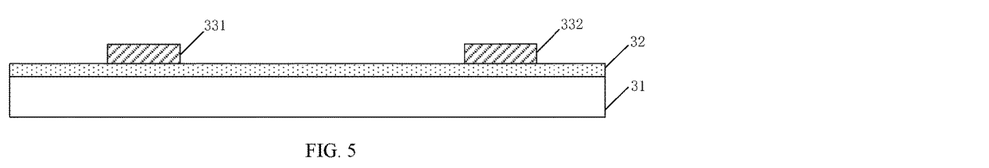
FIG. 5 is a schematic diagram of forming a first active layer and a second active layer in an embodiment of the present disclosure.

As shown in FIG. 5, a patterning process is performed on the active layer 33 to form the first active layer 331 and the second active layer 332.

Step 304, a gate insulator layer is formed on the first active layer and the second active layer.

Specifically, step 304 includes depositing the gate insulator layer on the first active layer and the second active layer. That is, the gate insulator layer is formed on the basal substrate with the first active layer and the second active layer.

Figure 6:
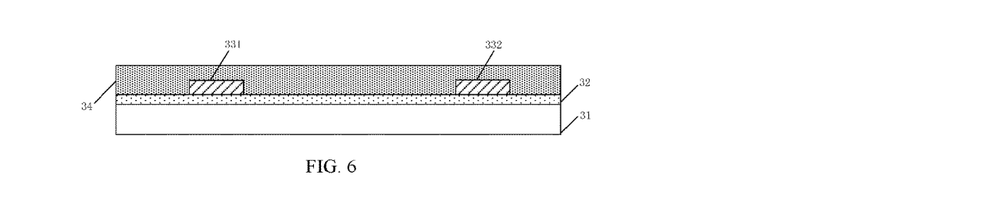
FIG. 6 is a schematic diagram of forming a gate insulator layer in an embodiment of the present disclosure.

As shown in FIG. 6, a gate insulator layer (GI Layer) 34 is formed on the first active layer 331 and the second active layer 332. The gate insulator layer 34 covers the basal substrate 31.

In some embodiments, the gate insulator layer 34 may be formed by silicon dioxide, silicon nitride or a mixed material of silicon dioxide and silicon nitride, and the thickness of the gate insulator layer 34 may be set based on actual requirements. Exemplarily, the gate insulator layer 34 may be formed on the basal substrate 31 with the first active layer 331 and the second active layer 332 by way of sputtering, PECVD or the like.

Step 305, the control electrode of the first thin film transistor, the connection pattern and the control electrode of the second thin film transistor are formed on the gate insulator layer.

In some embodiments, the control electrode of the first thin film transistor T1, the connection pattern and the control electrode of the second thin film transistor T2 are formed in the same layer.

Specifically, step 305 includes:

Step 3051, a gate layer is deposited on the gate insulator layer.

Figure 7:
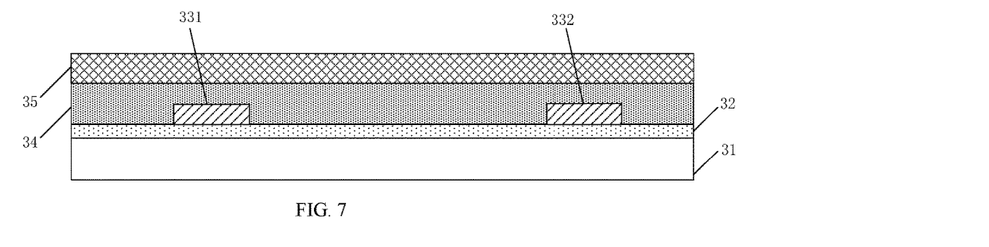
FIG. 7 is a schematic diagram of forming a gate layer in an embodiment of the present disclosure.

As shown in FIG. 7, a gate layer 35 is deposited on the gate insulator layer 34.

In some embodiments, a layer of gate material with a certain thickness may be deposited on the side of the gate insulator layer 34 away from the basal substrate 31 by way of sputtering, PECVD or the like to form the gate layer 35. The gate material may be a metal material, such as Mo, Cu, Al, an alloy material thereof, etc.

Figure 8:
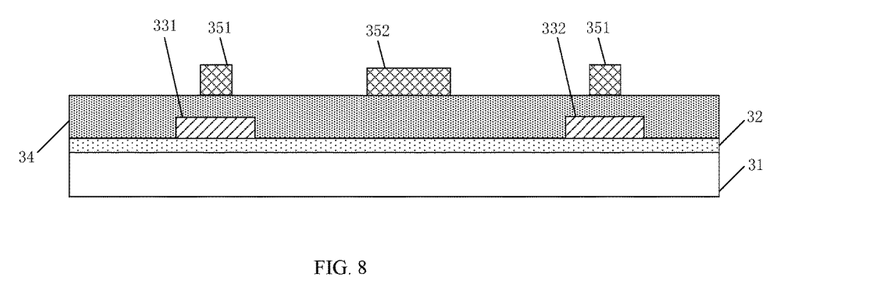
FIG. 8 is a schematic diagram of forming a control electrode of each thin film transistor in an embodiment of the present disclosure.

Step 3052, a patterning process is performed on the gate layer to form the control electrode of the first thin film transistor, the connection pattern and the control electrode of the second thin film transistor As shown in FIG. 8, a patterning process is performed on the gate layer 35 to form the control electrode 351 of the first thin film transistor T1, the connection pattern 352 and the control electrode 353 of the second thin film transistor T2.

Step 306, an interlayer dielectric is formed on the control electrode of the first thin film transistor, the connection pattern and the control electrode of the second thin film transistor.

Specifically, step 306 includes depositing an interlayer dielectric on the control electrode of the first thin film transistor, the connection pattern and the control electrode of the second thin film transistor.

Figure 9:
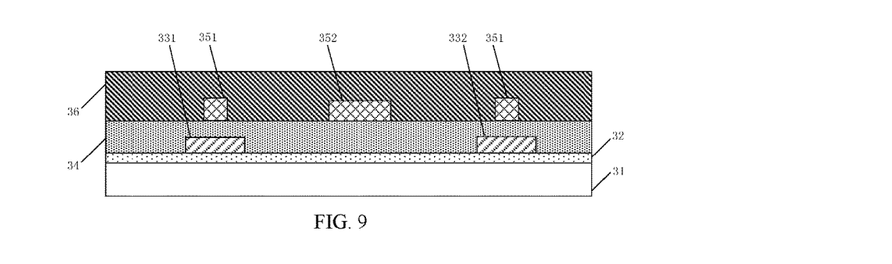
FIG. 9 is a schematic diagram of forming an interlayer dielectric in an embodiment of the present disclosure.

As shown in FIG. 9, an interlayer dielectric 36 (ILD) is deposited on the control electrode 351 of the first thin film transistor T1, the control electrode 353 of the second thin film transistor T2 and the connection pattern 352. The interlayer dielectric 36 covers the basal substrate 31.

The interlayer dielectric 36 may be formed by an insulating material, such as silicon dioxide, silicon nitride or the like.

Step 307, a patterning process is performed on the interlayer dielectric and the gate insulator layer to form a first via hole, a second via hole, a third via hole, a fourth via hole and a fifth via hole.

Figure 10:
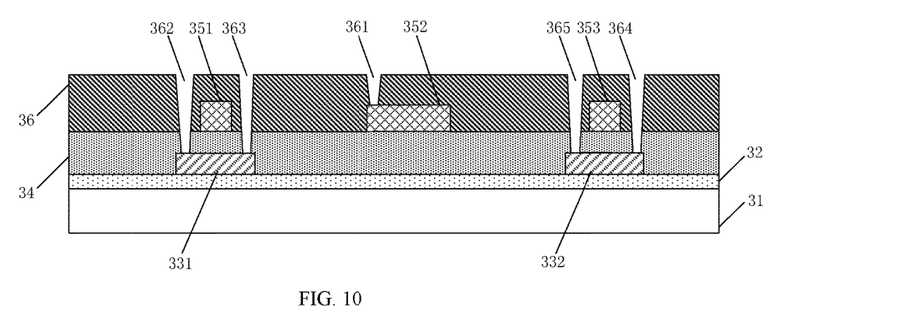
FIG. 10 is a schematic diagram of forming via holes in an embodiment of the present disclosure.

As shown in FIG. 10, after the patterning process is performed on the interlayer dielectric 36 and the gate insulator layer 34, the first via hole 361, the second via hole 362, the third via hole 363, the fourth via hole 364 and the fifth via hole 365 are formed, such that the first active layer 331, the second active layer 332 and the connection pattern 352 are exposed. The first via hole 361 is disposed in the interlayer dielectric 36, and is configured to expose the connection pattern 352. The second via hole 362, the third via hole 363, the fourth via hole 364 and the fifth via hole 365 are all disposed in the interlayer dielectric 36 and the gate insulator layer 34. Besides, the second via hole 362 and the third via hole 363 are configured to expose the first active layer 331, and the fourth via hole 364 and the fifth via hole 365 are configured to expose the second active layer 332.

Step 308, the first electrode of the first thin film transistor, the second electrode of the first thin film transistor, the first electrode of the second thin film transistor and the second electrode of the second thin film transistor are formed on the interlayer dielectric.

The first electrode of the first thin film transistor is connected to the first active layer through the second via hole. The second electrode of the first thin film transistor is connected to the first active layer through the third via hole. The second electrode of the first thin film transistor is connected to the connection pattern through the first via hole. The first electrode of the second thin film transistor is connected to the second active layer through the fourth via hole. The second electrode of the second thin film transistor is connected to the second active layer through the fifth via hole. A capacitor is formed between the second electrode of the second thin film transistor and the connection pattern.

In some embodiments, the first electrode of the first thin film transistor T1, the second electrode of the first thin film transistor T1, the first electrode of the second thin film transistor T2 and the second electrode of the second thin film transistor T2 are formed in the same layer.

Specifically, step 308 includes:

Step 3081, a source-drain layer is deposited on the interlayer dielectric.

Figure 11:
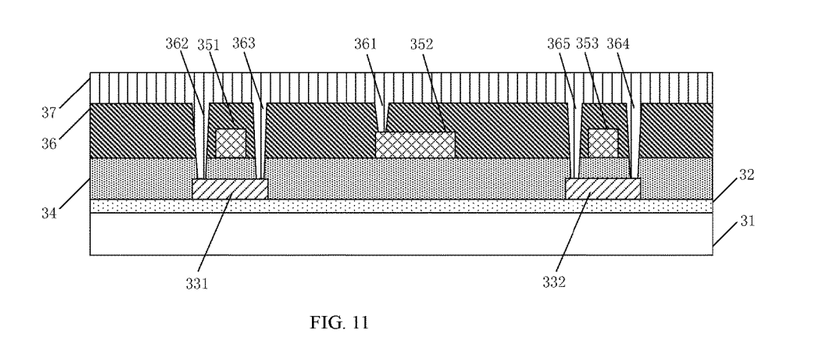
FIG. 11 is a schematic diagram of forming a source-drain layer in an embodiment of the present disclosure.

As shown in FIG. 11, alternatively, the source-drain layer 37 (SD Layer) is deposited on the interlayer dielectric 36 adopting the sputtering technology. The source-drain layer 37 is also formed in the first via hole 361, the second via hole 362, the third via hole 363, the fourth via hole 364 and the fifth via hole 365. Additionally, the source-drain layer 37 may also be formed on the basal substrate 31 with the interlayer dielectric 36 by way of PECVD.

The material of the source-drain layer may be the same as that of the gate layer. For example, the material of the source-drain layer may be Mo, Cu, Al and an alloy material thereof.

Step 3082, a patterning process is performed on the source-drain material layer to form the first electrode of the first thin film transistor, the second electrode of the first thin film transistor, the first electrode of the second thin film transistor and the second electrode of the second thin film transistor.

As shown in FIG. 12, the patterning process is performed on the source-drain layer 37 to form the first electrode 371 of the first thin film transistor, the second electrode 372 of the first thin film transistor, the first electrode 373 of the second thin film transistor and the second electrode 374 of the second thin film transistor.

In some embodiments, the first electrode 371 of the first thin film transistor T1 is connected to the first active layer 331 through the second via hole 362. The second electrode 372 of the first thin film transistor T1 is connected to the first active layer 331 through the third via hole 363. The second electrode 372 of the first thin film transistor T1 is further connected to the connection pattern 352 through the first via hole 361. The first electrode 373 of the second thin film transistor T2 is connected to the second active layer 332 through the fourth via hole 364. The second electrode 374 of the second thin film transistor T2 is connected to the second active layer 332 through the fifth via hole 365. A capacitor C is formed between the first electrode 373 of the second thin film transistor T2 and the connection pattern 352. The first electrode 371 of the first thin film transistor T1, the second electrode 372 of the first thin film transistor T1, the first electrode 373 of the second thin film transistor T2 and the second electrode 374 of the second thin film transistor T2 are formed in the same layer.

In the embodiments of the present disclosure, the patterning process includes photoresist coating, exposure, development, etching and photoresist peeling.

In the embodiments of the present disclosure, the test electrode of the test circuit, the control electrode of the first thin film transistor, the control electrode of the second thin film transistor and the connection pattern are formed in the same layer. Alternatively, the test electrode of the test circuit, the first electrode and the second electrode of the first thin film transistor and the first electrode and the second electrode of the second thin film transistor are formed in the same layer.

It should be noted that the manufacturing method provided in the embodiments of the present disclosure is used to manufacture the array substrate provided in the above embodiments, and other specific description may be made reference to the above embodiments, which will not be described here anymore.

In the method for manufacturing an array substrate provided in the embodiments of the present disclosure, a plurality of to-be-tested units are arranged in a matrix, a plurality of to-be-tested units in a row direction multiplex at least one test electrode, and a plurality of to-be-tested units in a column direction multiplex at least one test electrode. By reducing the number of the test electrodes and simplifying the structure of the test circuit, the detection efficiency is improved and the test cost is reduced. The test circuit is formed on the basal substrate, such that the properties of the display components may be detected and monitored instantaneously and the defective products may be detected effectively in real time, thereby saving the cost and time for producing the products.

Figure 13:
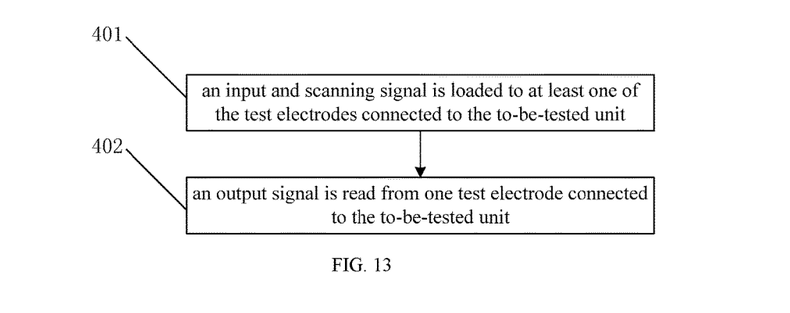
FIG. 13 is a flow chart of a method for testing a test circuit provided in an embodiment of the present disclosure.

FIG. 13 is a flow chart of a test method for a test circuit provided in the embodiments of the present disclosure. The method includes:

Step 401, an input and scanning signal is loaded to one test electrode connected to the to-be-tested unit.

Step 402, an output signal is read from one test electrode connected to the to-be-tested unit.

The test method in embodiments of the present disclosure may be used to test the first thin film transistor T1, the second thin film transistor T2 and the capacitor in the to-be-tested unit of the test circuit.

The first situation: when the test method is applied to the first thin film transistor T1 of the to-be-tested unit P, the input and scanning signal includes an input signal and a scanning signal. Step 401 includes: loading the scanning signal to the test electrode connected to the control electrode of the first thin film transistor of the to-be-tested unit to turn on the first thin film transistor, and loading the input signal to the test electrode connected to the first electrode of the first thin film transistor of the to-be-tested unit. Step 402 includes: reading the output signal from the test electrode connected to the second electrode of the first thin film transistor of the to-be-tested unit.

Further, the curve of the output signal as read may be compared with the normal curve of the output signal during the normal operation of the first thin film transistor T1. It may be determined that the first thin film transistor T1 is defective when the error between the curve of the output signal and the normal curve of the output signal is detected to be greater than a preset threshold.

Exemplarily, referring to FIG. 1, when a test is conducted to the first thin film transistors in the plurality of to-be-tested units in the first row, the scanning signal may be loaded to the test electrode 1 connected to the control electrodes of the plurality of first thin film transistors in the first row, such that the plurality of first thin film transistors in the first row are turned on. Then, the input signal may be loaded to the test electrode 2 connected to the first electrodes of the plurality of first thin film transistors in the first row. Afterwards, the output signal may be read from the test electrode connected to the second electrode of each first thin film transistor in the first row. That is, the output signal is read from test electrode 3, test electrode 6 and test electrode 7. It may be determined that among the plurality of first thin film transistors in the first row, the first thin film transistor whose second electrode is connected to the test electrode 3 (i.e., the first thin film transistor in the first row and the first column) is defective when the error between the curve of the output signal read from the test electrode 3 and the normal curve of the output signal is detected to be greater than the preset threshold.

The second situation: when the test method is applied to the second thin film transistor T2 of the to-be-tested unit P, the input and scanning signal includes an input signal and a scanning signal. Step 401 includes: loading the scanning signal to the test electrode connected to the control electrode of the second thin film transistor of the to-be-tested unit to turn on the second thin film transistor, and loading the input signal to the test electrode connected to the first electrode of the second thin film transistor of the to-be-tested unit. Step 402 includes: reading the output signal from the test electrode connected to the second electrode of the second thin film transistor of the to-be-tested unit.

Further, the curve of the output signal as read may be compared with the normal curve of the output signal during the normal operation of the second thin film transistor T2. It may be determined that the second thin film transistor T2 is defective when the error between the curve of the output signal and the normal curve of the output signal is detected to be greater than a preset threshold.

Exemplarily, referring to FIG. 1, when a test is conducted to the second thin film transistors in the plurality of to-be-tested units in the first column, the scanning signal may be loaded to the test electrode 3 connected to the control electrodes of the plurality of second thin film transistors in the first column, such that the plurality of second thin film transistors in the first column are turned on. Then, the input signal may be loaded to the test electrode 1 connected to the first electrodes of the plurality of second thin film transistors in the first column. Afterwards, the output signal may be read from the test electrode connected to the second electrode of each second thin film transistor in the first column. That is, the output signal is read from test electrode 2, test electrode 4 and test electrode 5. It may be determined that among the plurality of second thin film transistors in the first column, the second thin film transistor whose second electrode is connected to the test electrode 4 (i.e., the second thin film transistor in the second row and the first column) is defective when the error between the curve of the output signal read from the test electrode 4 and the normal curve of the output signal is detected to be greater than the preset threshold.

The third situation: when the test method is applied to the capacitor C of the to-be-tested unit P, step 401 includes: loading the input and scanning signal to the test electrode connected to the first end of the capacitor of the to-be-tested unit. Step 402 includes: reading the output signal from the test electrode connected to the second end of the capacitor of the to-be-tested unit.

Further, the curve of the output signal as read may be compared with the normal curve of the output signal during the normal operation of the capacitor C. It may be determined that the capacitor C is defective when the error between the curve of the output signal and the normal curve of the output signal is detected to be greater than a preset threshold.

Exemplarily, referring to FIG. 1, when a test is conducted to the capacitors C in the plurality of to-be-tested units in the first column, the scanning signal may be loaded to the test electrode 3 connected to the first ends of the plurality of capacitors in the first column. Then, the output signal may be read from the test electrode connected to the second end of each capacitor in the first column. That is, the output signal is read from test electrode 2, test electrode 4 and test electrode 5. It may be determined that among the plurality of capacitors C in the first column, the capacitor whose second end is connected to the test electrode 5 (i.e., the capacitor in the third row and the first column) is defective when the error between the curve of the output signal read from the test electrode 5 and the normal curve of the output signal is detected to be greater than the preset threshold It should be noted that the above method is applicable for testing the first thin film transistor, the second thin film transistor and the capacitor of any to-be-tested unit.

Figure 14:
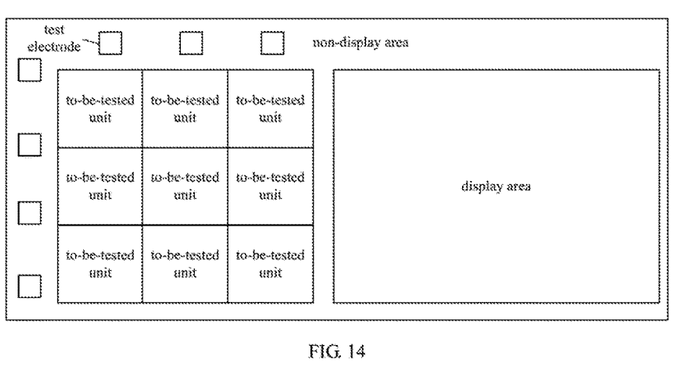
FIG. 14 is a diagram of a position of a test circuit on an array substrate in a test method provided in an embodiment of the present disclosure.

FIG. 14 is a schematic diagram of the position of the test circuit on the array substrate in the test method provided in the embodiments of the present disclosure. As shown in FIG. 14, the array substrate is formed with a display area and a non-display area around the display area. The test circuit is disposed in the non-display area of the array substrate. When a display unit in the display area is to be tested, a to-be-tested unit corresponding to the display unit in the display area needs to be produced in the non-display area. In other words, each to-be-tested unit in the test circuit corresponds a display unit (not shown) in the display area of the array substrate. The structure of the display unit to be tested in the display area and that of the to-be-tested unit in the non-display area are also arranged correspondingly and are the same. That is, each display unit in the display area and the corresponding to-be-tested unit in the non-display area have the same structure.

In some embodiments, the first thin film transistor in the display unit in the display area and the first thin film transistor in the to-be-tested unit correspondingly arranged in the non-display area may be formed simultaneously during the process of manufacturing the array substrate. The second thin film transistor in the display unit in the display area and the second thin film transistor in the to-be-tested unit correspondingly arranged in the non-display area may be formed simultaneously during the process of manufacturing the array substrate. The capacitor in the display unit in the display area and the capacitor correspondingly arranged in the non-display area may be formed simultaneously during the process of manufacturing the array substrate. That is, each component in the display unit and the corresponding component in the to-be-tested unit may be formed simultaneously during the process of manufacturing the array substrate.

Thus, during the process of testing the test circuit, if a to-be-tested unit in the non-display area is tested to be defective, it may be determined that the display unit correspondingly arranged in the display area is also defective. For example, when the first thin film transistor in a to-be-tested unit in the non-display area is tested, if the first thin film transistor is tested to be defective, it may be determined that the first thin film transistor in the display unit correspondingly arranged in the display area is also defective. When the capacitor in a to-be-tested unit in the non-display area is tested, if the capacitor is tested to be defective, it may be determined that the capacitor in the display unit correspondingly arranged in the display area is also defective. Likewise, whether other display units in the display area are defective or not may be determined in accordance with whether the to-be-tested units correspondingly arranged in the non-display area are defective. Thus, the defective to-be-tested units in the display area may be processed in time.

Figure 15:
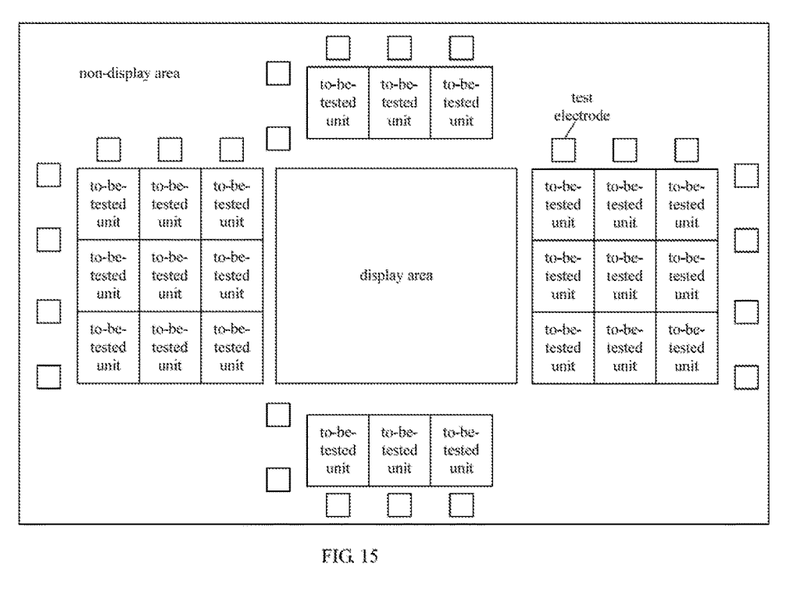
FIG. 15 is a diagram of another position of a test circuit on an array substrate in a test method provided in an embodiment of the present disclosure.

It should be noted that the position of the test circuit on the array substrate is not limited to the position shown in FIG. 14 and may also be the position shown in FIG. 15. In the position diagram shown in FIG. 15, the to-be-tested units are arranged around the display area. The position of the test circuit on the array substrate will not be described here anymore. For the sake of clarity, the to-be-tested units, the test electrodes, the non-display area and the display area in the figures are not drawn in accordance with the actual scale.

The test method provided in the embodiments of the present disclosure is used to test the test circuit provided in the above embodiments. The specific description of the test circuit may be made reference to the above embodiments, which will not be described here anymore.

In the test method for a test circuit provided in the embodiments of the present disclosure, a plurality of to-be-tested units are arranged in a matrix, a plurality of to-be-tested units in a row direction multiplex at least one test electrode, and a plurality of to-be-tested units in a column direction multiplex at least one test electrode. By reducing the number of the test electrodes and simplifying the structure of the test circuit, the detection efficiency is improved and the test cost is reduced. The test method may also detect and monitor the properties of display components instantaneously and detect defective products effectively in real time, thereby saving the cost and time for producing the products.

The embodiments of the present disclosure further provide a non-transitory readable storage medium storing instructions that, when executed on a processing component, cause the processing component to perform the test method provided in the embodiments above.

Understandably, the embodiments above are merely exemplary embodiments for illustrating the principle of the present disclosure, and the present disclosure is no limited thereto. Variations and improvements to the embodiments herein may be available to those skilled in the art without departing from the spirits and substantial contents of the present disclosure and these variations and improvements are within the scope of the present disclosure.

What is claimed is:

1. A test circuit, comprising a plurality of to-be-tested units and a plurality of test electrodes connected to the to-be-tested units, wherein the plurality of to-be-tested units are arranged in a matrix, at least one of the test electrodes is multiplexed by the plurality of to-be-tested units in a row direction, and at least one of the test electrodes is multiplexed by the plurality of to-be-tested units in a column direction, wherein the plurality of to-be-tested units in any row direction multiplex two of the test electrodes, and the plurality of to-be-tested units in any column direction multiplex one of the test electrodes; or the plurality of to-be-tested units in adjacent two rows multiplex one of the test electrodes.

2. The test circuit according to claim 1, wherein each of the to-be-tested units includes a first to-be-tested component and a second to-be-tested component connected to the first to-be-tested component, the first to-be-tested components of the plurality of to-be-tested units in any row direction multiplex two of the test electrodes, the second to-be-tested components of the plurality of to-be-tested units in any row direction multiplex two of the test electrodes, and the first to-be-tested components and the second to-be-tested components of the plurality of to-be-tested units in any column direction multiplex one of the test electrodes.

3. The test circuit according to claim 2, wherein the two test electrodes multiplexed by the first to-be-tested components of a plurality of to-be-tested units in any row direction are the same two test electrodes multiplexed by the second to-be-tested components of the plurality of to-be-tested units in this row direction.

4. The test circuit according to claim 3, wherein each of the to-be-tested units further includes a third to-be-tested component connected to the first to-be-tested component and to the second to-be-tested component.

5. The test circuit according to claim 4, wherein the first to-be-tested component is a first thin film transistor, the second to-be-tested component is a second thin film transistor, the third to-be-tested component is a capacitor, a second electrode of the first thin film transistor is connected to a first node, a control electrode of the second thin film transistor is connected to the first node, a first end of the capacitor is connected to the first node, and a second end of the capacitor is connected to a second electrode of the second thin film transistor.

6. The test circuit according to claim 5, wherein a first electrode and a control electrode of the first thin film transistor are connected to two test electrodes respectively, and a first electrode and a second electrode of the second thin film transistor are connected to two test electrodes respectively.

7. The test circuit according to claim 6, wherein the control electrodes of the first thin film transistors and the first electrodes of the second thin film transistors of the plurality of to-be-tested units in any row direction multiplex one of the test electrodes, the first electrodes of the first thin film transistors and the second electrodes of the second thin film transistors of the plurality of to-be-tested units in any row direction multiplex one of the test electrodes, and the second electrodes of the first thin film transistors of the plurality of to-be-tested units in any column direction multiplex one of the test electrodes.

8. The test circuit according to claim 6, wherein the control electrodes of the second thin film transistors of the plurality of to-be-tested units in any column direction multiplex one of the test electrodes.

9. The test circuit according to claim 7, wherein the second electrodes of the first thin film transistors and the control electrodes of the second thin film transistors of the plurality of to-be-tested units in any column direction multiplex one of the test electrodes.

10. The test circuit according to claim 8, wherein the second electrodes of the first thin film transistors and the control electrodes of the second thin film transistors of the plurality of to-be-tested units in any column direction multiplex one of the test electrodes.

11. The test circuit according to claim 5, wherein the first electrode of the second thin film transistor of the to-be-tested unit in any row except a first row and the second electrode of the second thin film transistor of the to-be tested unit correspondingly arranged in a previous row are connected and multiplex one of the test electrodes.

12. The test circuit according to claim 5, wherein the control electrode of the first thin film transistor and the first electrode of the second thin film transistor of the to-be-tested unit in any row except a first row and the first electrode of the first thin film transistor and the second electrode of the second thin film transistor of the to-be-tested unit correspondingly arranged in a previous row multiplex one of the test electrodes.

13. An array substrate, comprising a basal substrate and the test circuit according to claim 1.

14. A method for manufacturing an array substrate, comprising:

forming a test circuit on a basal substrate;

wherein the test circuit includes a plurality of to-be-tested units and a plurality of test electrodes connected to the to-be-tested units, the plurality of to-be-tested units are arranged in a matrix, at least one of the test electrodes is multiplexed by the plurality of to-be-tested units in a row direction, at least one of the test electrodes is multiplexed by the plurality of to-be-tested units in a column direction, each of the to-be-tested units includes a first to-be-tested component, a second to-be-tested component connected to the first to-be-tested component, and a third to-be-tested component connected to the first to-be-tested component and to the second to-be-tested component, the first to-be-tested component is a first thin film transistor, the second to-be-tested component is a second thin film transistor, the third to-be-tested component is a capacitor, a second electrode of the first thin film transistor is connected to a first node, a control electrode of the second thin film transistor is connected to the first node, a first end of the capacitor is connected to the first node, a second end of the capacitor is connected to a second electrode of the second thin film transistor.

15. The manufacturing method according to claim 14, wherein forming the test circuit on the basal substrate includes:

forming a first active layer and a second active layer on the basal substrate;

forming a gate insulator layer on the first active layer and the second active layer;

forming a control electrode of the first thin film transistor, a connection pattern and the control electrode of the second thin film transistor on the gate insulator layer;

forming an interlayer dielectric on the control electrode of the first thin film transistor, the control electrode of the second thin film transistor and the connection pattern;

performing a patterning process on the interlayer dielectric and the gate insulator layer to form a first via hole, a second via hole, a third via hole, a fourth via hole and a fifth via hole; and forming a first electrode of the first thin film transistor, the second electrode of the first thin film transistor, a first electrode of the second thin film transistor and the second electrode of the second thin film transistor on the interlayer dielectric; wherein the first electrode of the first thin film transistor is connected to the first active layer through the second via hole, the second electrode of the first thin film transistor is connected to the first active layer through the third via hole, the second electrode of the first thin film transistor is further connected to the connection pattern through the first via hole, the first electrode of the second thin film transistor is connected to the second active layer through the fourth via hole, the second electrode of the second thin film transistor is connected to the second active layer through the fifth via hole, and the capacitor is formed between the second electrode of the second thin film transistor and the connection pattern.

16. A method for testing a test circuit, wherein the test circuit includes a plurality of to-be-tested units and a plurality of test electrodes connected to the to-be-tested units, the plurality of to-be-tested units are arranged in a matrix, at least one of the test electrodes is multiplexed by the plurality of to-be-tested units in a row direction, at least one of the test electrodes is multiplexed by the plurality of to-be-tested units in a column direction, each of the to-be-tested units includes a first to-be-tested component, a second to-be-tested component connected to the first to-be-tested component, and a third to-be-tested component connected to the first to-be-tested component and to the second to-be-tested component, the first to-be-tested component is a first thin film transistor, the second to-be-tested component is a second thin film transistor, the third to-be-tested component is a capacitor, a second electrode of the first thin film transistor is connected to a first node, a control electrode of the second thin film transistor is connected to the first node, a first end of the capacitor is connected to the first node, a second end of the capacitor is connected to a second electrode of the second thin film transistor, the test method comprising:

loading an input and scanning signal to at least one of the test electrodes connected to a to-be-tested unit; and reading an output signal from one of the test electrodes connected to the to-be-tested unit.

17. The test method according to claim 16, wherein the input and scanning signal includes an input signal and a scanning signal; loading the input and scanning signal to the at least one of the test electrodes connected to the to-be-tested unit includes: loading the scanning signal to the test electrode connected to a control electrode of the first thin film transistor of the to-be-tested unit, and loading the input signal to the test electrode connected to a first electrode of the first thin film transistor of the to-be-tested unit; and reading the output signal from one of the test electrodes connected to the to-be-tested unit includes: reading the output signal from the test electrode connected to the second electrode of the first thin film transistor of the to-be-tested unit; or the input and scanning signal includes an input signal and a scanning signal; loading the input and scanning signal to the at least one of the test electrodes connected to the to-be-tested unit includes: loading the scanning signal to the test electrode connected to the control electrode of the second thin film transistor of the to-be-tested unit, and loading the input signal to the test electrode connected to a first electrode of the second thin film transistor of the to-be-tested unit; and reading the output signal from one of the test electrodes connected to the to-be-tested unit includes: reading the output signal from the test electrode connected to the second electrode of the second thin film transistor of the to-be-tested unit; or loading the input and scanning signal to the at least one of the test electrodes connected to the to-be-tested unit includes: loading the input and scanning signal to the test electrode connected to the first end of the capacitor of the to-be-tested unit; and reading the output signal from one of the test electrodes connected to the to-be-tested unit includes: reading the output signal from the test electrode connected to the second end of the capacitor of the to-be-tested unit.

18. A non-transitory readable storage medium storing instructions that, when executed by a processing component, cause the processing component to perform the test method of claim 16.

* * * * *